(12) United States Patent
Ohashi et al.

(10) Patent No.: US 11,362,219 B2
(45) Date of Patent: Jun. 14, 2022

(54) SEMICONDUCTOR DEVICE

(71) Applicant: KABUSHIKI KAISHA TOSHIBA, Tokyo (JP)

(72) Inventors: Teruyuki Ohashi, Kawasaki (JP); Hiroshi Kono, Himeji (JP); Masaru Furukawa, Himeji (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 29 days.

(21) Appl. No.: 17/014,082

(22) Filed: Sep. 8, 2020

(65) Prior Publication Data

US 2021/0288188 A1 Sep. 16, 2021

(30) Foreign Application Priority Data

Mar. 11, 2020 (JP) .............................. JP2020-041890

(51) Int. Cl.
*H01L 29/872* (2006.01)
*H01L 29/78* (2006.01)
*H01L 29/06* (2006.01)

(52) U.S. Cl.
CPC ........ *H01L 29/872* (2013.01); *H01L 29/0696* (2013.01); *H01L 29/7804* (2013.01); *H01L 29/7806* (2013.01)

(58) Field of Classification Search
None
See application file for complete search history.

(56) References Cited

U.S. PATENT DOCUMENTS

| | | | |
|---|---|---|---|
| 10,128,370 B2 | 11/2018 | Ebihara et al. | |
| 10,297,685 B2 | 5/2019 | Mizukami | |
| 2004/0119076 A1* | 6/2004 | Ryu | H01L 29/0878 257/77 |
| 2015/0171166 A1* | 6/2015 | Liu | H01L 21/8258 257/369 |
| 2016/0079411 A1* | 3/2016 | Hino | H01L 29/0615 257/77 |
| 2019/0371935 A1 | 12/2019 | Hatta et al. | |

FOREIGN PATENT DOCUMENTS

| | | |
|---|---|---|
| JP | 5940235 B1 | 6/2016 |
| JP | 5992094 B2 | 9/2016 |
| JP | 6168370 B2 | 7/2017 |
| JP | 2019-57573 A | 4/2019 |
| JP | 6498363 B2 | 4/2019 |

* cited by examiner

*Primary Examiner* — Xiaoming Liu

(74) *Attorney, Agent, or Firm* — Oblon, McClelland, Maier & Neustadt, L.L.P.

(57) ABSTRACT

According to one embodiment, a semiconductor device includes a first element region. The first element region includes first, second, and third semiconductor regions, and first, and second conductive layers. The first semiconductor region includes first, second, and third partial regions. A second direction from the first partial region toward the first conductive layer crosses a first direction from the second partial region toward the first partial region. The third partial region is between the second partial region and the second conductive layer in the second direction. The second semiconductor region includes a first semiconductor portion. The first semiconductor portion is between the first partial region and the first conductive layer in the second direction. At least a portion of the third semiconductor region is between the first partial region and the first semiconductor portion in the second direction.

21 Claims, 9 Drawing Sheets ations.

SEMICONDUCTOR DEVICE

CROSS-REFERENCE TO RELATED APPLICATIONS

This application is based upon and claims the benefit of priority from Japanese Patent Application No. 2020-041890, filed on Mar. 11, 2020; the entire contents of which are incorporated herein by reference.

FIELD

Embodiments of the invention generally relate to a semiconductor device.

BACKGROUND

For example, it is desirable for the characteristic fluctuation of a semiconductor device such as a transistor or the like to be small.

DETAILED DESCRIPTION

Figure 1:
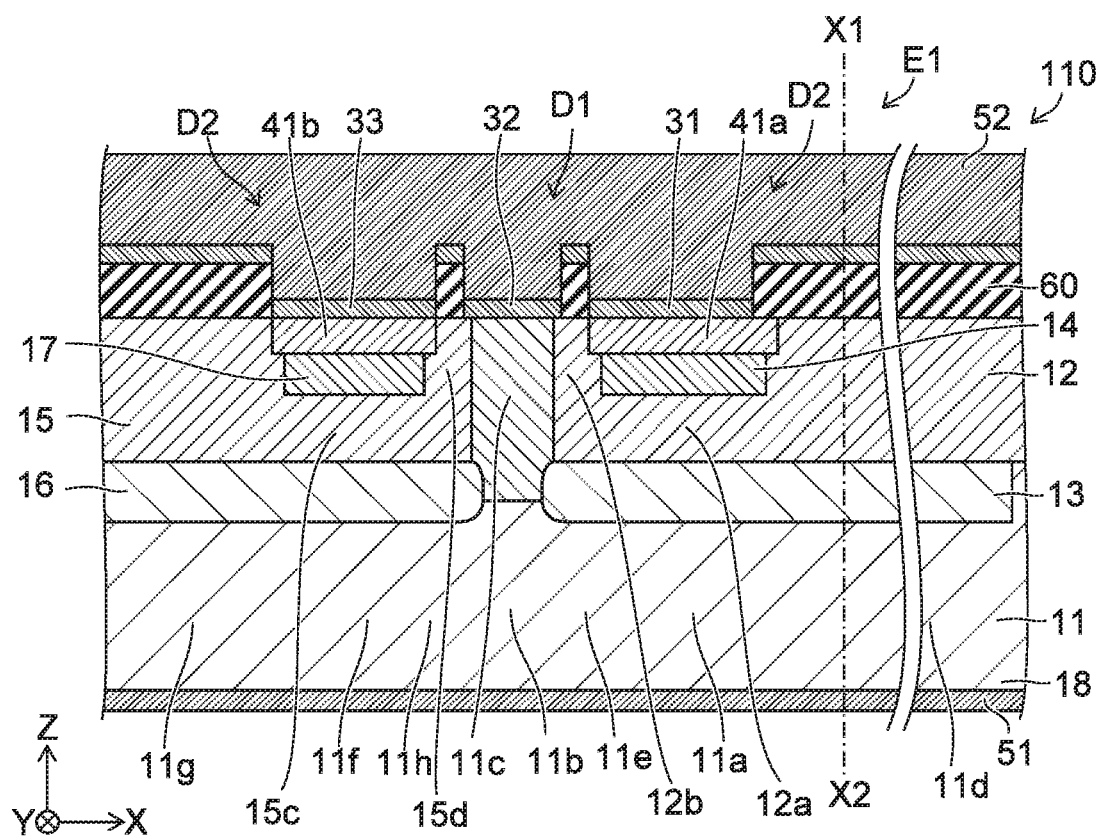
FIG. 1 is a schematic cross-sectional view illustrating a semiconductor device according to a first embodiment.

According to one embodiment, a semiconductor device includes a first element region. The first element region includes a first semiconductor region, a second semiconductor region, a third semiconductor region, a first conductive layer, and a second conductive layer. The first semiconductor region includes a first partial region, a second partial region, and a third partial region, and is of a first conductivity type. A second direction from the first partial region toward the first conductive layer crosses a first direction from the second partial region toward the first partial region. The third partial region is between the second partial region and the second conductive layer in the second direction. The second conductive layer has a Schottky contact with the third partial region. The second semiconductor region includes a first semiconductor portion, and is of a second conductivity type. The first semiconductor portion is between the first partial region and the first conductive layer in the second direction. The third semiconductor region is of the first conductivity type. At least a portion of the third semiconductor region is between the first partial region and the first semiconductor portion in the second direction. A concentration of an impurity of the first conductivity type in the third semiconductor region is greater than a concentration of the impurity of the first conductivity type in the first partial region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first element region E1. The semiconductor device 110 may include a second element region, which is described below. The second element region is, for example, a cell region. As described below, at least a portion of the first element region E1 is provided outside the second element region. The first element region E1 is, for example, a terminal region.

The first element region E1 includes a first semiconductor region 11, a second semiconductor region 12, a third semiconductor region 13, a first conductive layer 31, and a second conductive layer 32.

The first semiconductor region 11 includes a first partial region 11a, a second partial region 11b, and a third partial region 11c. The first semiconductor region 11 is of a first conductivity type. A first direction from the second partial region 11b toward the first partial region 11a crosses a second direction from the second partial region 11b toward the third partial region 11c.

The first direction is taken as an X-axis direction. One direction perpendicular to the X-axis direction is taken as a Z-axis direction. A direction perpendicular to the X-axis direction and the Z-axis direction is taken as a Y-axis direction. The second direction is, for example, the Z-axis direction.

The second direction (the Z-axis direction) from the first partial region 11a toward the first conductive layer 31 crosses the first direction from the second partial region 11b toward the first partial region 11a.

The third partial region 11c is between the second partial region 11b and the second conductive layer 32 in the second direction (the Z-axis direction). For example, the direction from the second conductive layer 32 toward the first conductive layer 31 is along the first direction (the X-axis direction). The second conductive layer 32 has a Schottky contact with the third partial region 11c. For example, a Schottky barrier diode D1 is formed of the third partial region 11c and the second conductive layer 32.

The second semiconductor region 12 includes a first semiconductor portion 12a. The second semiconductor region 12 is of a second conductivity type. The first semiconductor portion 12a is between the first partial region 11a and the first conductive layer 31 in the second direction (the Z-axis direction).

The first conductive layer 31 is electrically connected to the second semiconductor region 12. For example, a parasitic p-n diode D2 is formed of the first conductive layer 31, the second semiconductor region 12, and the first partial region 11a of the first semiconductor region 11.

The third semiconductor region 13 is of the first conductivity type.

For example, the first conductivity type is an n-type, and the second conductivity type is a p-type. In the embodiment, the first conductivity type may be the p-type, and the second conductivity type may be the n-type. Hereinbelow, the first conductivity type is taken to be the n-type, and the second conductivity type is taken to be the p-type.

At least a portion of the third semiconductor region 13 is between the first partial region 11a and the first semiconductor portion 12a in the second direction (the Z-axis direction). The third semiconductor region 13 is connected to the third partial region 11c. For example, it is possible for a current to flow between the third semiconductor region 13 and the third partial region 11c.

For example, the concentration of an impurity of the first conductivity type in the third semiconductor region 13 is greater than the concentration of the impurity of the first conductivity type in the first partial region 11a. For example, the concentration of the impurity of the first conductivity type in the third semiconductor region 13 is greater than the concentration of the impurity of the first conductivity type in the second partial region 11b. For example, the concentration of the impurity of the first conductivity type in the third semiconductor region 13 is greater than the concentration of the impurity of the first conductivity type in the third partial region 11c.

For example, because the third semiconductor region 13 is provided, the parasitic p-n diode D2 formed of the first partial region 11a and the second semiconductor region 12 does not switch on easily. The position in the X-axis direction where the parasitic p-n diode D2 switches on is far from the position in the X-axis direction of the Schottky barrier diode D1.

By such a configuration, for example, the electron current that is injected from the second conductive layer 32 toward the third partial region 11c and the hole current that is injected from the first conductive layer 31 toward the second semiconductor region 12 are spatially separated. Recombination of the electrons and the holes is suppressed thereby. By suppressing the recombination, the expansion of defects inside the semiconductor can be suppressed. For example, the formation of defects inside the semiconductor can be suppressed. The characteristic fluctuation of the semiconductor device can be suppressed thereby. For example, the breakdown of the semiconductor device can be suppressed. According to the embodiment, a semiconductor device can be provided in which the characteristic fluctuation can be small. For example, high reliability is obtained.

The first semiconductor region 11, the second semiconductor region 12, and the third semiconductor region 13 include, for example, SiC. When the semiconductor region includes SiC, recombination causes enlargement of stacking faults, and characteristic degradation easily occurs. The characteristic degradation includes, for example, the degradation of an on-voltage Vf of the diode. The characteristic degradation includes, for example, the degradation of an on-resistance Ron of a MOSFET. The characteristic degradation includes, for example, the degradation of a threshold voltage Vth of the MOSFET. When the semiconductor region includes SiC, the recombination is suppressed by providing the third semiconductor region 13 described above; therefore, the characteristic fluctuation can be effectively reduced. For example, high reliability is obtained.

As shown in FIG. 1, the semiconductor device 110 may include a first electrode 51 and a second electrode 52. The direction from the first electrode 51 toward the second electrode 52 is along the second direction (the Z-axis direction). In the example, at least a portion of the first semiconductor region 11 is between the first electrode 51 and the second electrode 52. The first conductive layer 31 and the second conductive layer 32 are between the first semiconductor region 11 and the second electrode 52. The first conductive layer 31 and the second conductive layer 32 are electrically connected to the second electrode 52. For example, the second conductive layer 32 contacts the second semiconductor region 12.

As described below, when the cell region includes a transistor or the like, for example, the first electrode 51 corresponds to a drain electrode, and the second electrode 52 corresponds to a source electrode.

In the example as shown in FIG. 1, the first element region E1 further includes a fourth semiconductor region 14. The fourth semiconductor region 14 is of the second conductivity type (e.g., the p-type). The fourth semiconductor region 14 is provided between the first semiconductor portion 12a and the first conductive layer 31 in the second direction (the Z-axis direction). The concentration of an impurity of the second conductivity type in the fourth semiconductor region 14 is greater than the concentration of the impurity of the second conductivity type in the second semiconductor region 12 (e.g., the first semiconductor portion 12a).

In one example, the first conductive layer 31 has an ohmic contact with the fourth semiconductor region 14.

In the example, the first element region E1 further includes a first compound region 41a. The first compound region 41a is provided between the fourth semiconductor region 14 and the first conductive layer 31. The first conductive layer 31 is electrically connected to the fourth semiconductor region 14 via the first compound region 41a. The first compound region 41a includes, for example, a silicide. The first compound region 41a includes, for example, a silicide including nickel (e.g., $NiSi_2$). A good electrical connection is obtained by providing the first compound region 41a.

As shown in FIG. 1, the first semiconductor region 11 may further include a fourth partial region 11d. The first partial region 11a is between the second partial region 11b and the fourth partial region 11d in the first direction (the X-axis direction). The direction from the fourth partial region 11d toward a portion of the third semiconductor region 13 is along the second direction (the Z-axis direction). For example, the third semiconductor region 13 is longer than the first conductive layer 31 along the X-axis direction. Thereby, for example, the electron current and the hole current can be effectively separated spatially.

As shown in FIG. 1, the second semiconductor region 12 may further include a second semiconductor portion 12b. The second semiconductor portion 12b is between the third partial region 11c and the fourth semiconductor region 14 in the first direction (the X-axis direction). For example, the first semiconductor region 11 further includes a fifth partial region 11e. The fifth partial region 11e is between the second partial region 11b and the first partial region 11a in the first direction (the X-axis direction). A portion of the third semiconductor region 13 is between the fifth partial region 11e and the second semiconductor portion 12b in the second direction (the Z-axis direction). A stable connection with the third partial region 11c is obtained by such a third semiconductor region 13.

As shown in FIG. 1, the first element region E1 may further include a third conductive layer 33, a second-conductivity-type (e.g., p-type) fifth semiconductor region 15, and a first-conductivity-type (e.g., n-type) sixth semiconductor region 16.

The first semiconductor region 11 further includes a sixth partial region 11f. The second partial region 11b is between the sixth partial region 11f and the first partial region 11a in the first direction (the X-axis direction). The fifth semiconductor region 15 includes a third semiconductor portion 15c. At least a portion of the sixth partial region 11f is between the sixth partial region 11f and the third semiconductor portion 15c in the second direction (the Z-axis direction). The sixth semiconductor region 16 is connected to the third partial region 11c. The concentration of the impurity of the first conductivity type in the sixth semiconductor region 16 is greater than the concentration of the impurity of the first conductivity type in the third partial region 11c.

For example, another parasitic p-n diode D2 is formed of the sixth partial region 11f, the fifth semiconductor region 15, and the third conductive layer 33. By providing the sixth semiconductor region 16, for example, the electron current that is injected from the second conductive layer 32 toward the third partial region 11c and the hole current that is injected from the third conductive layer 33 toward the fifth semiconductor region 15 are spatially separated. The recombination of the electrons and the holes is suppressed thereby. By suppressing the recombination, the defects in the semiconductor region can be suppressed. The fluctuation of the characteristics of the semiconductor device can be suppressed thereby. According to the embodiment, a semiconductor device can be provided in which the characteristic fluctuation can be reduced. For example, high reliability is obtained.

In one example, the distance along the first direction (the X-axis direction) between the third semiconductor region 13 and the sixth semiconductor region 16 is less than the length along the first direction of the second conductive layer 32.

As shown in FIG. 1, the first element region E1 may further include a seventh semiconductor region 17 of the second conductivity type. The seventh semiconductor region 17 is provided between the third semiconductor portion 15c and the third conductive layer 33 in the second direction (the Z-axis direction). The concentration of the impurity of the second conductivity type in the seventh semiconductor region 17 is greater than the concentration of the impurity of the second conductivity type in the fifth semiconductor region 15 (e.g., the third semiconductor portion 15c).

As shown in FIG. 1, the first element region E1 may further include a second compound region 41b. The second compound region 41b includes, for example, a silicide (e.g., $NiSi_2$, etc.). The second compound region 41b is provided between the seventh semiconductor region 17 and the third conductive layer 33. The third conductive layer 33 is electrically connected to the seventh semiconductor region 17 via the second compound region 41b.

As shown in FIG. 1, the first semiconductor region 11 may further include a seventh partial region 11g. The sixth partial region 11f is provided between the seventh partial region 11g and the second partial region 11b in the first direction (the X-axis direction). The first semiconductor region 11 may further include an eighth partial region 11h. The eighth partial region 11h is provided between the sixth partial region 11f and the second partial region 11b in the first direction (the X-axis direction).

The fifth semiconductor region 15 may include a fourth semiconductor portion 15d. The fourth semiconductor portion 15d is provided between the seventh semiconductor region 17 and the third partial region 11c in the X-axis direction. The fourth semiconductor portion 15d is provided between the eighth partial region 11h and the fourth semiconductor portion 15d in the Z-axis direction. A portion of the sixth semiconductor region 16 is between the seventh partial region 11g and the fifth semiconductor region 15 in the second direction (the Z-axis direction).

As shown in FIG. 1, the first element region E1 may include an eighth semiconductor region 18. For example, the eighth semiconductor region 18 is of the first conductivity type. The eighth semiconductor region 18 may be, for example, a substrate. The eighth semiconductor region 18 may be, for example, a SiC substrate.

For example, the first semiconductor region 11 may be formed by epitaxial growth on the eighth semiconductor region 18. For example, the second to seventh semiconductor regions 12 to 17 described above are formed by introducing impurities into portions of the first semiconductor region 11.

When these semiconductor regions include SiC, for example, the n-type impurity includes at least one selected from the group consisting of N, P, and As. For example, the p-type impurity includes at least one selected from the group consisting of B, Al, and Ga.

The concentration of the impurity of the first conductivity type in the first semiconductor region 11 is, for example, not less than $1.1 \times 10^{15}/cm^3$ and not more than $5 \times 10^{16}/cm^3$.

The concentrations of the impurity of the second conductivity type in the second and fifth semiconductor regions 12 and 15 are, for example, not less than $5 \times 10^{18}/cm^3$ and not more than $1 \times 10^{19}/cm^3$.

The concentrations of the impurity of the first conductivity type in the third and sixth semiconductor regions 13 and 16 are, for example, not less than $5 \times 10^{15}/cm^3$ and not more than $5 \times 10^{17}/cm^3$. It is favorable for the concentrations of the impurity of the first conductivity type in the third and sixth semiconductor regions 13 and 16 to be, for example, not less than $6 \times 10^{16}/cm^3$ and not more than $2 \times 10^{17}/cm^3$.

The concentrations of the impurity of the second conductivity type in the fourth and seventh semiconductor regions 14 and 17 are, for example, not less than $1 \times 10^{19}/cm^3$ and not more than $1 \times 10^{21}/cm^3$.

The concentration of the impurity of the first conductivity type in the eighth semiconductor region 18 is, for example, not less than $1 \times 10^{18}/cm^3$ and not more than $1 \times 10^{20}/cm^3$. An example of profiles of the impurities in the semiconductor regions recited above are described below.

At least a portion of the first semiconductor region 11 is, for example, an n⁻-region. The third partial region 11c is, for example, an n⁻-region. The second semiconductor region 12 and the fifth semiconductor region 15 are, for example, p⁻-regions. The third semiconductor region 13 and the sixth semiconductor region 16 are, for example, n⁺-regions. The fourth semiconductor region 14 and the seventh semiconductor region 17 are, for example, p⁺-regions.

The first conductive layer 31, the second conductive layer 32, and the third conductive layer 33 include at least one selected from the group consisting of Ti, Ni, Mo, and polysilicon.

As shown in FIG. 1, the first element region E1 may include an insulating member 60. For example, the insulating member 60 is provided between the second electrode 52 and the various semiconductor regions described above. The insulating member 60 includes, for example, silicon oxide (e.g., $SiO_2$, etc.).

Figure 2A:
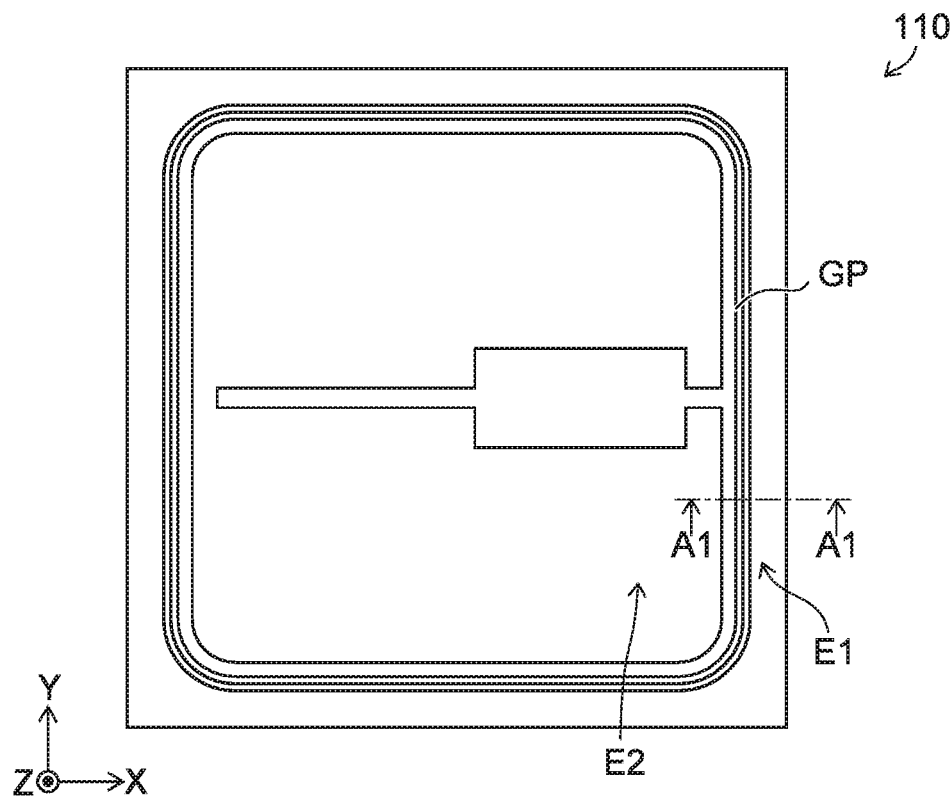
FIGS. 2A and 2B are schematic views illustrating the semiconductor device according to the first embodiment.
Figure 2B:
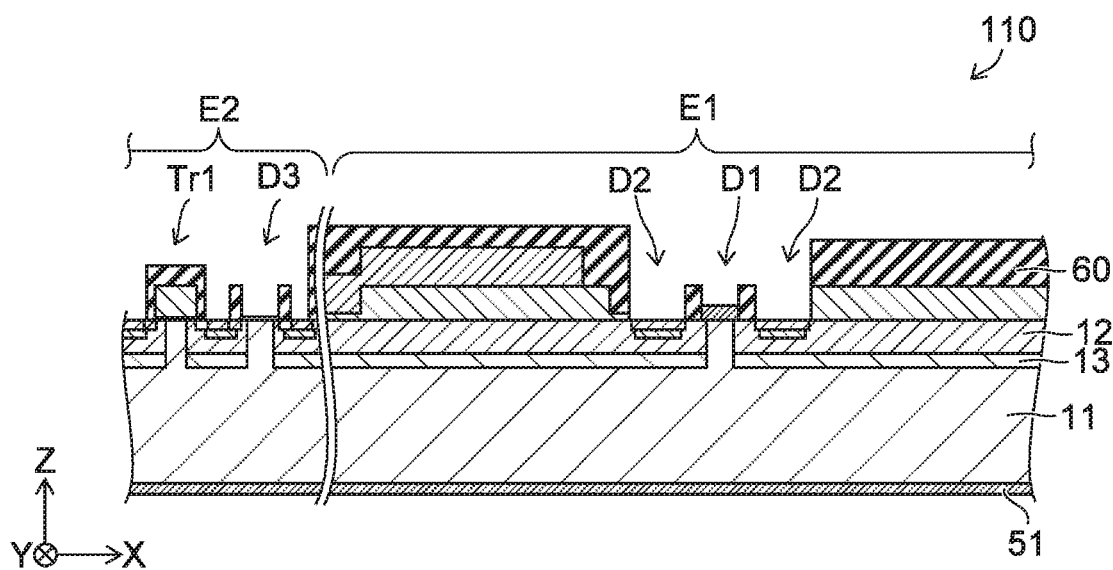

FIGS. 2A and 2B are schematic views illustrating the semiconductor device according to the first embodiment.

FIG. 2A is a plan view. FIG. 2B is a line A1-A1 cross-sectional view of FIG. 2A.

As shown in FIGS. 2A and 2B, the semiconductor device 110 further includes a second element region E2 (a cell region) in addition to the first element region E1. The second element region E2 includes at least one of a transistor Tr1 or a diode D3. At least a portion of the first element region E1 is provided outside the second element region E2. The configuration illustrated in FIG. 1 is provided in the first element region E1. The shape of a gate electrode (an interconnect GP) is illustrated in FIG. 2A. The diode D3 is, for example, a Schottky barrier diode in the second element region E2 (the cell region). The parasitic p-n diode of the transistor Tr1 (e.g., a MOS transistor) in the second element region E2 is clamped by the diode D3 (the Schottky barrier diode). The unintended injection of charge (e.g., holes) due to the parasitic p-n diode is suppressed thereby.

On the other hand, when the third semiconductor region 13 and the sixth semiconductor region 16 described above are not provided in the first element region E1 (the terminal region), the parasitic p-n diode D2 of the first element region E1 easily switches to the on-state. Therefore, the distance between the electron current from the Schottky barrier diode D1 and the hole current from the parasitic p-n diode D2 is short. Therefore, recombination easily occurs.

The third semiconductor region 13 and the sixth semiconductor region 16 are provided in the embodiment. The distance between the electron current from the Schottky barrier diode D1 and the hole current from the parasitic p-n diode D2 is increased thereby. The recombination is effectively suppressed thereby.

Figure 3:
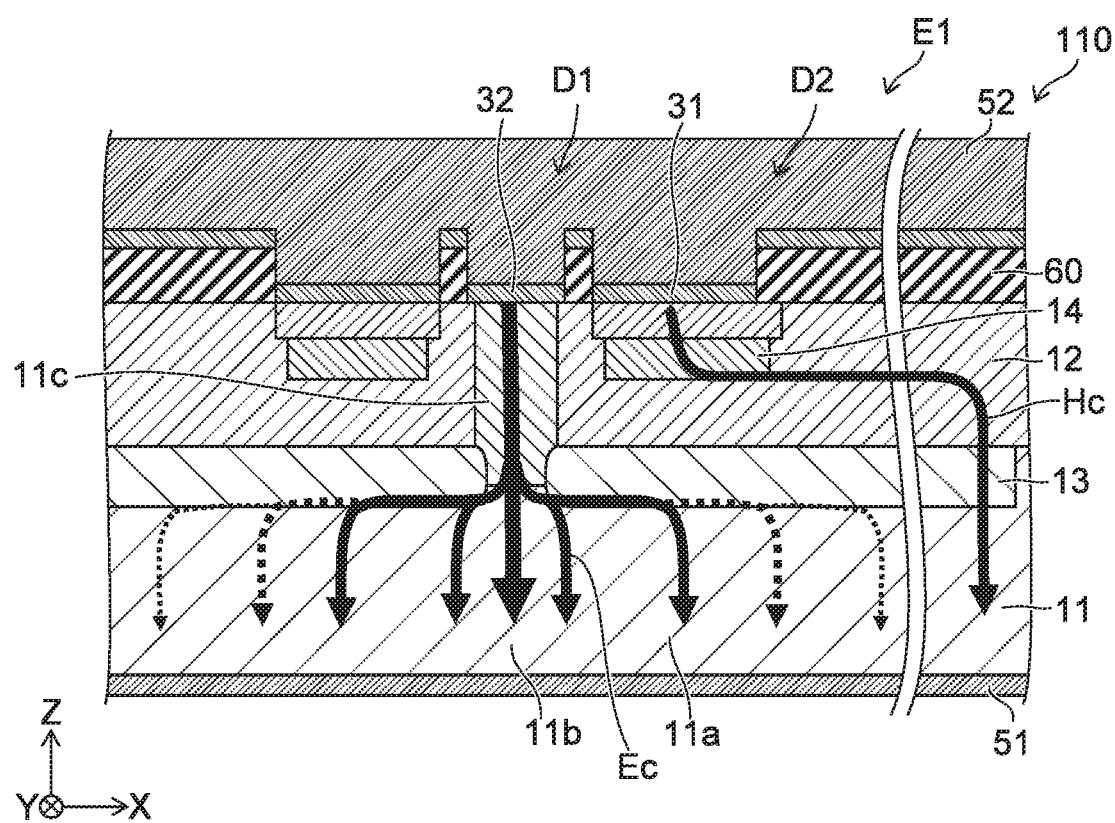
FIG. 3 is a schematic cross-sectional view illustrating characteristics of the semiconductor device according to the first embodiment.

FIG. 3 is a schematic cross-sectional view illustrating characteristics of the semiconductor device according to the first embodiment.

As shown in FIG. 3, electrons Ec flow from the second conductive layer 32 toward the first semiconductor region 11. Because the third semiconductor region 13 is provided in the embodiment, the electrons Ec flow from the third partial region 11c toward the third semiconductor region 13. The flow of the electrons Ec (the electron current) spreads along the X-axis direction (along the X-Y plane). The parasitic p-n diode D2 does not easily switch on in the region through which the electrons Ec flow along the X-axis direction. Therefore, holes Hc from the first conductive layer 31 do not easily enter the region through which the electrons Ec flow along the X-axis direction. The holes Hc flow in a distant region in the X-axis direction when viewed from the second conductive layer 32.

The density of the electrons Ec is high directly under the second conductive layer 32 and low away from the second conductive layer 32. The density of the electrons is low in the region through which the holes Hc flow. The recombination of the electrons and the holes is suppressed thereby.

Figure 4:
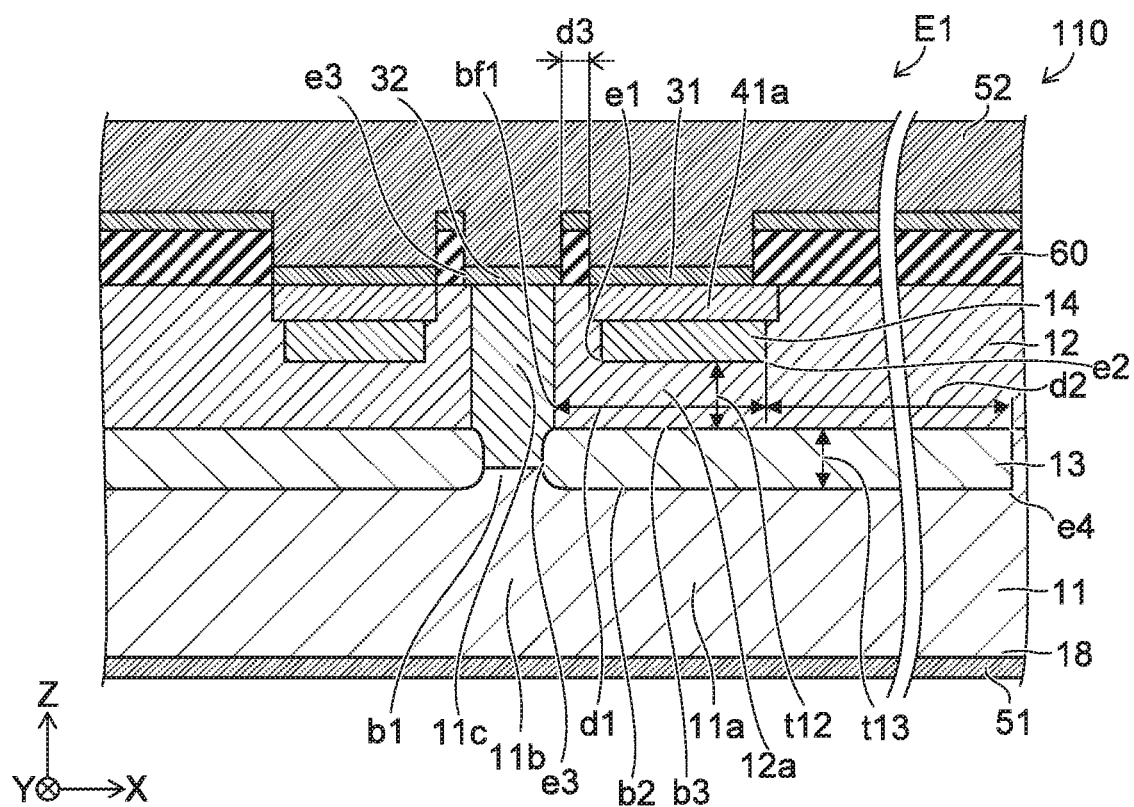
FIG. 4 is a schematic cross-sectional view illustrating the semiconductor device according to the first embodiment.

FIG. 4 is a schematic cross-sectional view illustrating the semiconductor device according to the first embodiment.

In the semiconductor device 110 according to the embodiment as shown in FIG. 4, the fourth semiconductor region 14 includes a first end e1 and a second end e2. The direction from the first end e1 toward the second end e2 is along the first direction (the X-axis direction). The position in the first direction (the X-axis direction) of the first end e1 is between the position in the first direction (the X-axis direction) of the third partial region 11c and the position in the first direction (the X-axis direction) of the second end e2. For example, the position in the first direction (the X-axis direction) of the first end e1 is between the position in the first direction (the X-axis direction) of the second end e2 and the position in the first direction (the X-axis direction) of a boundary bf1 between the third partial region 11c and the second semiconductor region 12.

The third semiconductor region 13 includes a third end e3 and a fourth end e4. The direction from the third end e3 toward the fourth end e4 is along the first direction (the X-axis direction). The position of the fourth end e4 may match the position of the outer edge of the second semiconductor region 12. The position of the fourth end e4 may match the position of the outer edge of the first element region E1. The position in the first direction (the X-axis direction) of the first end e1 is between the position in the first direction of the third end e3 and the position in the first direction of the fourth end e4.

For example, the position in the first direction of the boundary bf1 described above is between the position in the first direction of the third end e3 and the position in the first direction of the first end e1. The position in the first direction of the boundary bf1 may match the position in the first direction of the third end e3.

The position in the first direction (the X-axis direction) of the second end e2 is between the position in the first direction of the first end e1 and the position in the first direction of the fourth end e4. The distance in the first direction between the position in the first direction of the second end e2 and the position in the first direction (the X-axis direction) of the boundary bf1 between the third partial region 11c and the second semiconductor region 12 is taken as a first distance d1. The distance in the first direction between the position in the first direction of the second end e2 and the position in the first direction of the fourth end e4 is taken as a second distance d2. The second distance d2 corresponds to the length of the region through which the third semiconductor region 13 extends along the X-axis direction when viewed from the fourth semiconductor region 14.

In the embodiment, it is favorable for the second distance d2 to be greater than the first distance d1. Thereby, the position at which the holes Hc are substantially injected can be farther from the position at which the density of the electrons Ec is high.

In the embodiment, for example, the second distance d2 may be not less than 2 times the first distance d1. The second distance d2 may be not less than 3 times the first distance d1. The second distance d2 may be not less than 5 times the first distance d1. The second distance d2 may be not less than 10 times the first distance d1.

In one example according to the embodiment, the second distance d2 is, for example, 5 μm or more. The second distance d2 may be, for example, 10 μm or less.

As shown in FIG. 4, the length along the second direction (the Z-axis direction) of the third semiconductor region 13 is taken as a thickness t13. The thickness t13 is, for example, not less than 0.1 μm and not more than 2 μm. The thickness t13 may be, for example, not less than 0.2 μm and not more than 2 μm. For example, the thickness t13 is not less than 0.001 times and not more than 1 times the second distance d2.

In one example, the thickness t13 along the second direction of the third semiconductor region 13 is not less than 0.1 times and not more than 5 times a thickness t12 along the second direction of the first semiconductor portion 12a.

The distance along the first direction (the X-axis direction) between the first conductive layer 31 and the second conductive layer 32 is taken as a third distance d3. The third distance d3 is, for example, not less than 0.5 µm and not more than 2 µm. By setting the third distance d3 to be 0.5 µm or more, for example, the manufacturing is easier. By setting the first distance d1 to be 2 µm or less, it is easier to downsize the semiconductor device.

As shown in FIG. 4, the boundary between the second partial region 11b and the third partial region 11c is taken as a first boundary b1. The boundary between the first partial region 11a and the third semiconductor region 13 is taken as a second boundary b2. The boundary between the third semiconductor region 13 and the second semiconductor region 12 is taken as a third boundary b3. For example, the first boundary b1 corresponds to the lower end of the third partial region 11c. For example, the second boundary b2 corresponds to the lower end of the third semiconductor region 13. For example, the third boundary b3 corresponds to the lower end of the second semiconductor region 12.

For example, the position in the second direction (the Z-axis direction) of the first boundary b1 is between the position in the second direction of the second boundary b2 and the position in the second direction of the third boundary b3. Thereby, for example, the current that flows in the third semiconductor region 13 from the third partial region 11c is more than the current flowing in the second partial region 11b from the third partial region 11c. For example, the difference between the potential of the third semiconductor region 13 and the potential of the second semiconductor region 12 is small. For example, the parasitic p-n diode D2 can be clamped farther in the X-axis direction.

Figure 5:
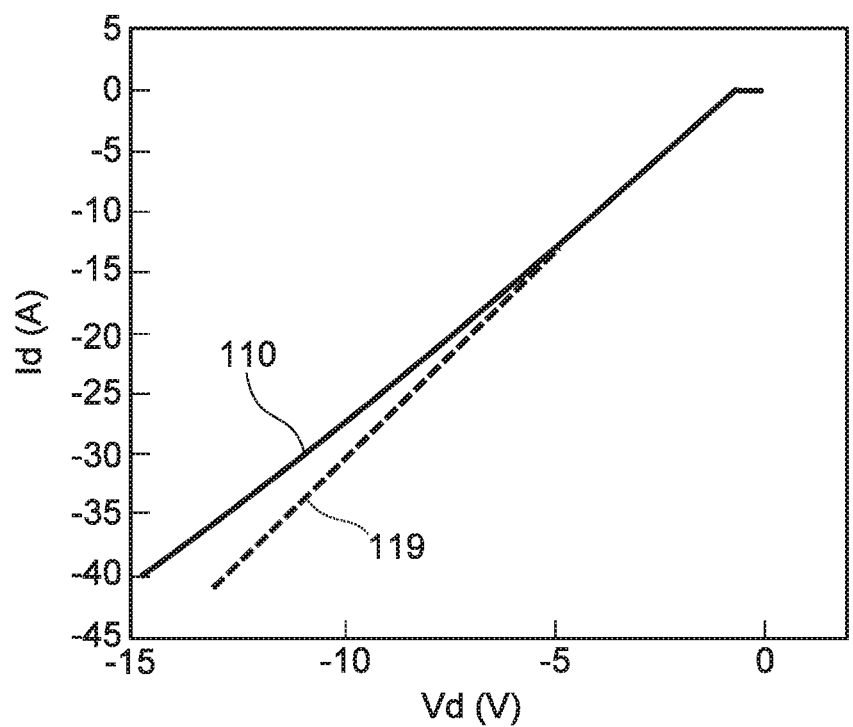
FIG. 5 is a graph illustrating characteristics of semiconductor devices.

FIG. 5 is a graph illustrating characteristics of semiconductor devices.

The horizontal axis of FIG. 5 is a drain voltage Vd. The vertical axis of FIG. 5 is a drain current Id. In FIG. 5, the measurement results of a characteristic of a semiconductor device 119 of a first reference example are illustrated in addition to the measurement results of a characteristic of the semiconductor device 110 according to the embodiment. A Schottky diode is not provided in the semiconductor device 119. Otherwise, the configuration of the semiconductor device 119 is similar to the configuration of the semiconductor device 110.

As shown in FIG. 5, for the same drain voltage Vd, the absolute value of the drain current Id of the semiconductor device 110 is small compared to the semiconductor device 119. It is considered that this is caused by the current based on the parasitic p-n diode D2 of the first element region E1 in the semiconductor device 110 being small compared to that of the semiconductor device 119.

Figure 6:
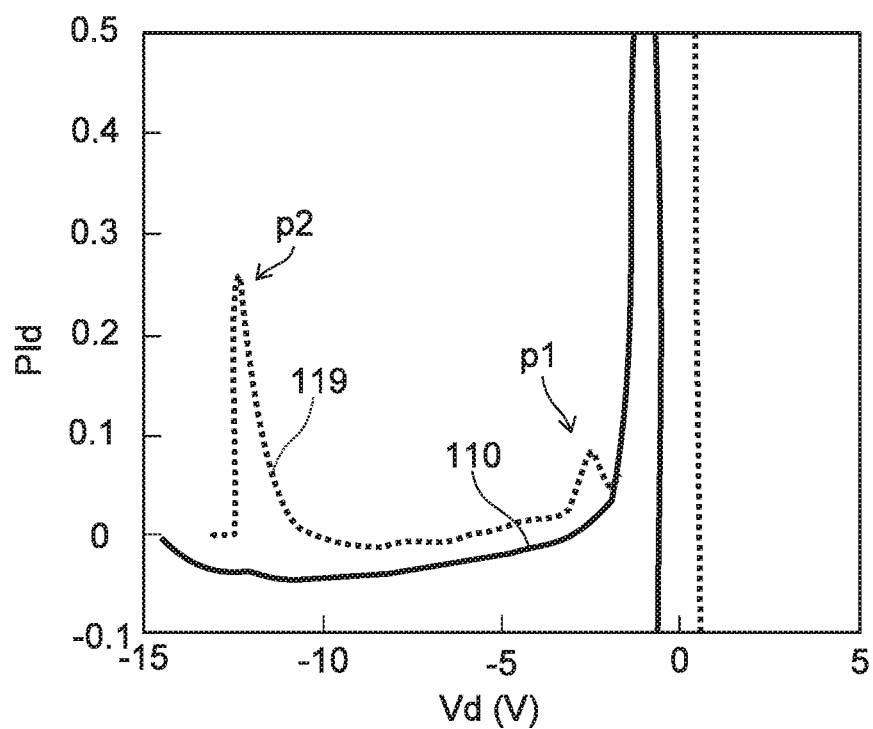
FIG. 6 is a graph illustrating characteristics of semiconductor devices.

FIG. 6 is a graph illustrating characteristics of semiconductor devices.

The horizontal axis of FIG. 6 is the drain voltage Vd. The vertical axis of FIG. 6 is a parameter PId. The parameter PId corresponds to the second derivative of the drain current Id with respect to the change of the drain voltage Vd.

As shown in FIG. 6, a peak p1 and a peak p2 are observed for the semiconductor device 119. The peak p1 is caused by the parasitic p-n diode D2 of the first element region E1. The peak p2 is caused by the diode D3 of the second element region E2. As shown in FIG. 6, these peaks are not observed for the semiconductor device 110. Light emissions that correspond to the peaks described above are observed for the semiconductor device 119. Light emission is not observed for the semiconductor device 110.

Figure 7:
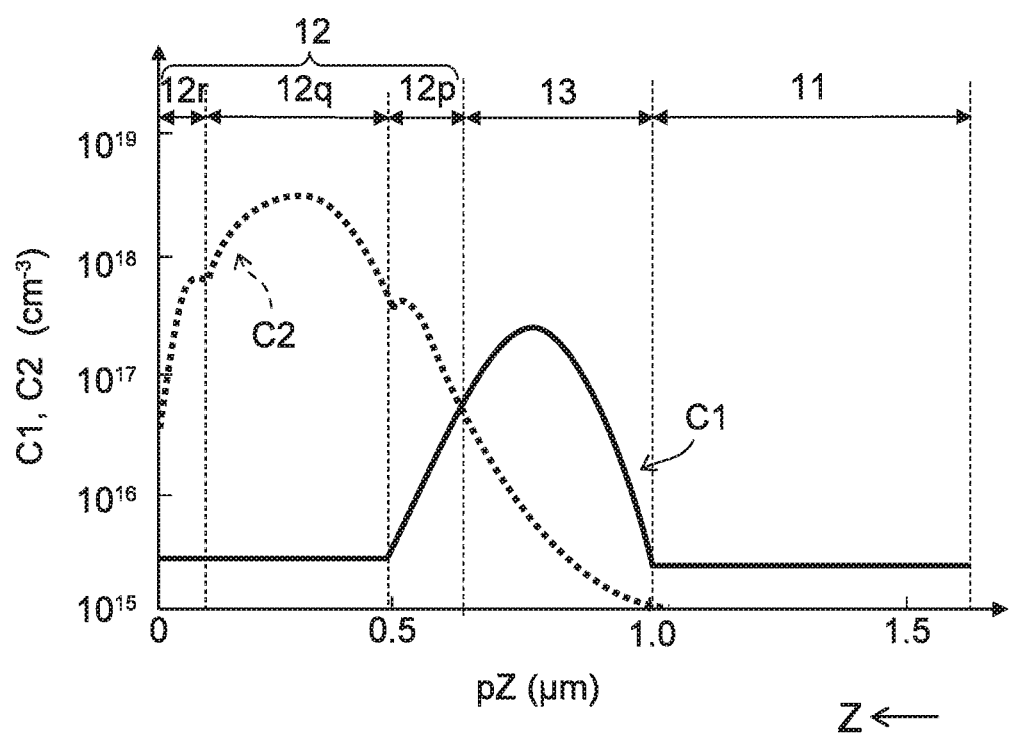
FIG. 7 is a schematic view illustrating the semiconductor device according to the embodiment.

FIG. 7 is a schematic view illustrating the semiconductor device according to the embodiment.

FIG. 7 illustrates profiles of the concentrations of the impurities in the semiconductor region of the semiconductor device 110. FIG. 7 corresponds to profiles along line segment X1-X2 of FIG. 1. The horizontal axis of FIG. 7 is a position pZ in the Z-axis direction. The vertical axis is a concentration C1 of the impurity of the first conductivity type and a concentration C2 of the impurity of the second conductivity type. As shown in FIG. 7, the third semiconductor region 13 includes the impurity of the first conductivity type and the impurity of the second conductivity type. The concentration C2 of the impurity of the second conductivity type includes a "mountain skirt" at the position of the third semiconductor region 13.

As shown in FIG. 7, the second semiconductor region 12 may include a region 12p, a region 12q, and a region 12r. The region 12q is between the third semiconductor region 13 and the region 12r. The region 12p is between the third semiconductor region 13 and the region 12q. The region 12r is, for example, a front-surface region. The region 12q is, for example, an intermediate region. The region 12p is a deep region. The impurity concentration of the second conductivity type in the region 12r is, for example, not less than $1\times10^{15}/cm^3$ and not more than $1\times10^{18}/cm^3$. For example, the threshold voltage is appropriately adjusted by such a concentration. The impurity concentration of the second conductivity type in the region 12q is, for example, not less than $1\times10^{17}/cm^3$ and not more than $1\times10^{18}/cm^3$. For example, punch-through can be suppressed by such a concentration. The impurity concentration of the second conductivity type in the region 12p is, for example, not less than $1\times10^{16}/cm^3$ and not more than $1\times10^{17}/cm^3$. For example, a high breakdown voltage is obtained by such a concentration.

In the embodiment, for example, the positions in the Z-axis direction of the fourth and seventh semiconductor regions 14 and 17 may correspond to the position in the Z-axis direction of the region 12q.

FIGS. 8A, 8B, 9A, 9B, and 10 are graphs illustrating characteristics of the semiconductor device.

Simulation results that relate to characteristics of the semiconductor device for first to sixth conditions CC1 to CC6 described below are shown in these figures. For the first condition CC1, a Schottky barrier diode is not provided in the terminal region. For the second to sixth conditions CC2 to CC6, a Schottky barrier diode is provided in the terminal region. For the second condition CC2, the third semiconductor region 13 is not provided in the configuration illustrated in FIG. 1.

The third to sixth conditions CC3 to CC6 have the configuration illustrated in FIG. 1. The thickness t13 of the third semiconductor region 13 is taken to be the full width at half maximum of the peak of the impurity of the first conductivity type of the third semiconductor region 13. For the third condition CC3, the peak of the impurity concentration of the first conductivity type in the third semiconductor region 13 is $6\times10^{16}/cm^3$, and the thickness t13 is 0.1 µm. For the fourth condition CC4, the peak of the impurity concentration of the first conductivity type in the third semiconductor region 13 is $1.2\times10^{16}/cm^3$, and the thickness t13 is 0.1 µm. For the fifth condition CC5, the peak of the impurity concentration of the first conductivity type in the third semiconductor region 13 is $1.2\times10^{17}/cm^3$, and the thickness t13 is 0.15 µm. For the sixth condition CC6, the peak of the impurity concentration of the first conductivity type in the third semiconductor region 13 is $1.2\times10^{17}/cm^3$, and the thickness t13 is 0.2 μm.

Figure 8A:
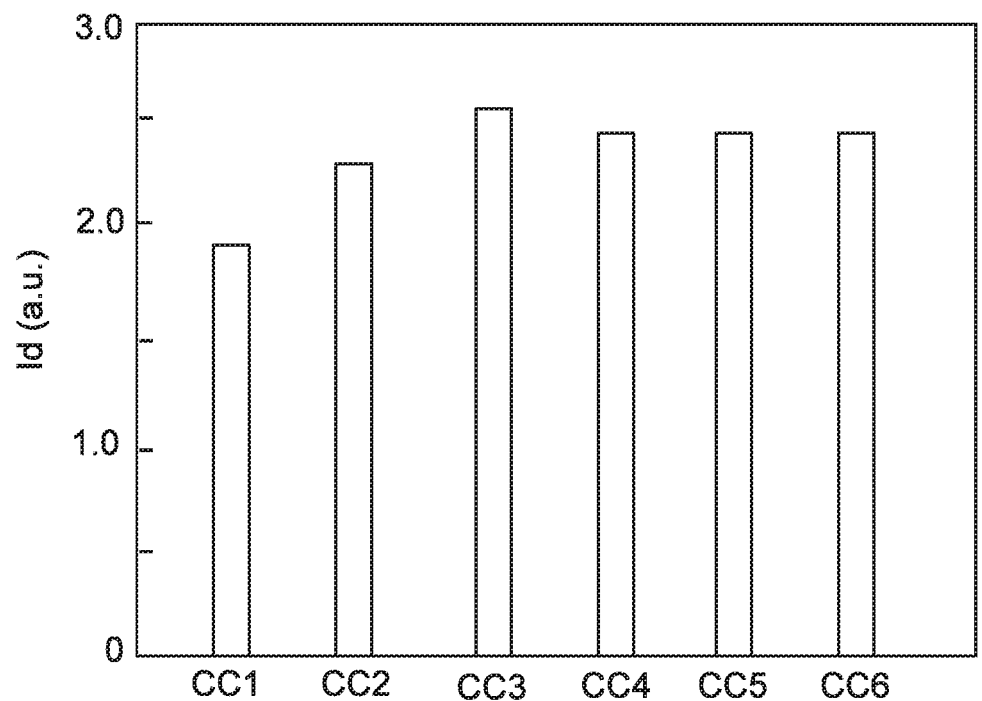
FIGS. 8A and 8B are graphs illustrating characteristics of the semiconductor device.
Figure 8B:
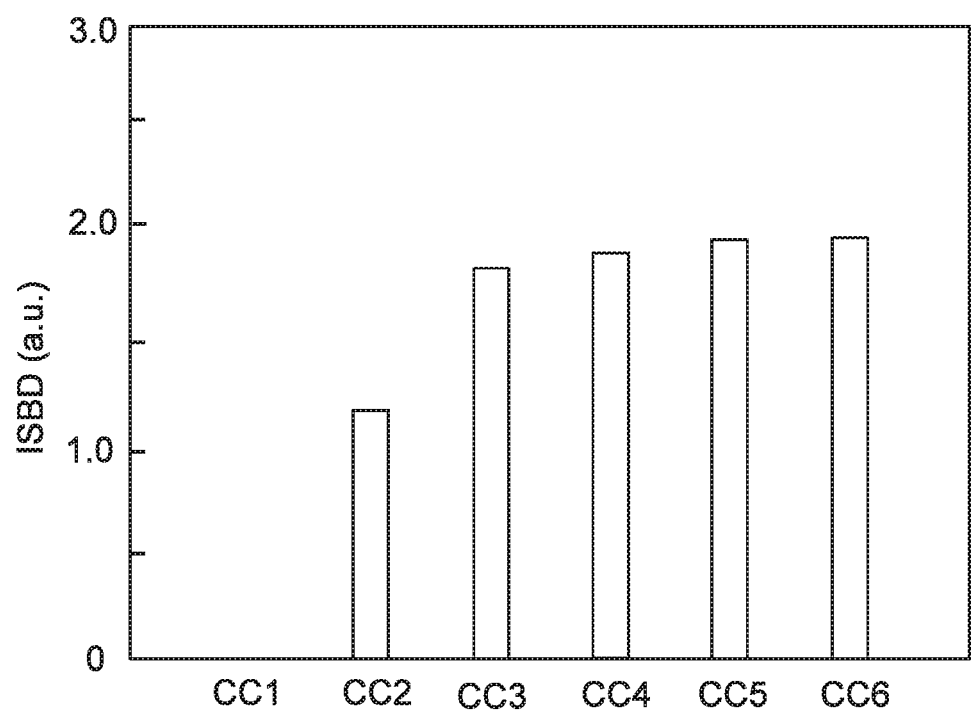
Figure 9A:
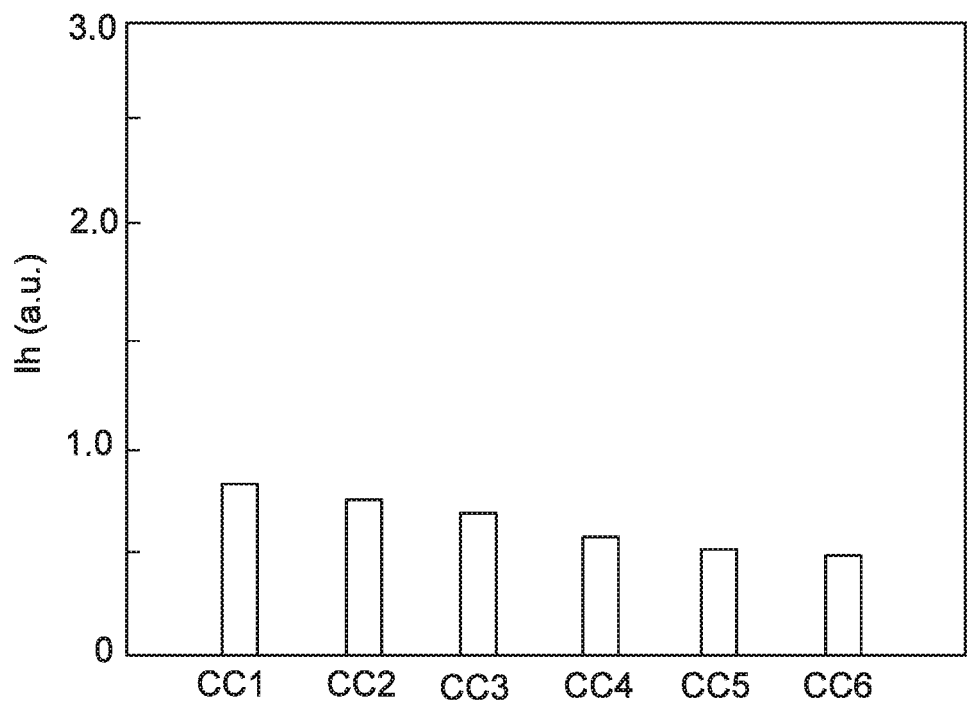
FIGS. 9A and 9B are graphs illustrating characteristics of the semiconductor device.
Figure 9B:
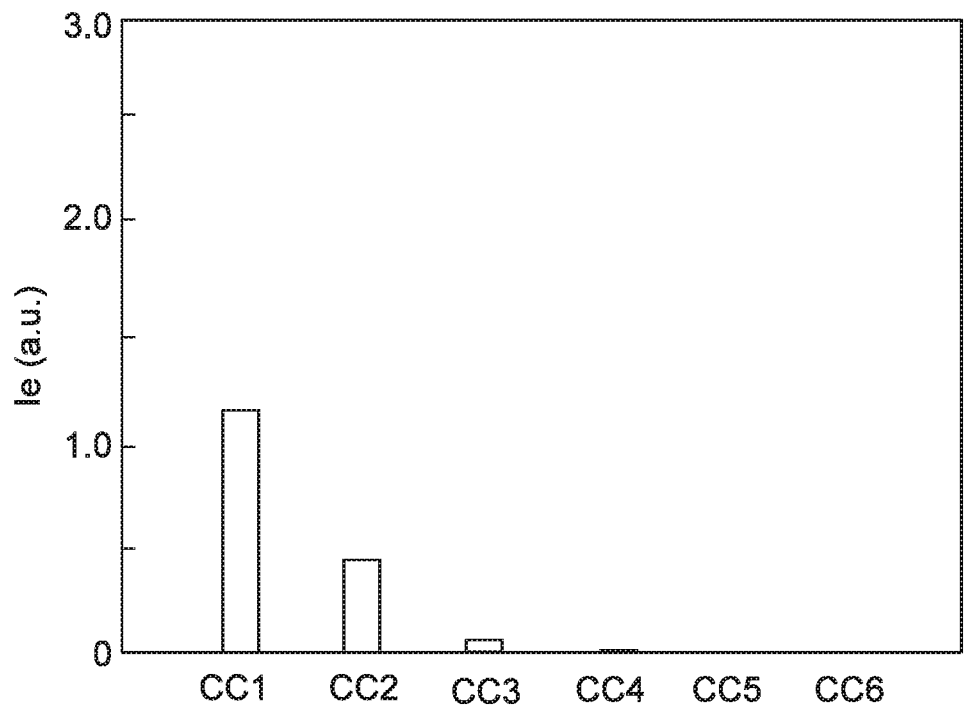

The vertical axis of FIG. 8A is the drain current Id. The vertical axis of FIG. 8B is a current ISBD flowing in the Schottky barrier diode. The vertical axis of FIG. 9A is a hole current Ih flowing from the first conductive layer 31. The vertical axis of FIG. 9B is an electron current Ie flowing from the first conductive layer 31. The drain voltage is 4 V for these characteristics.

As shown in FIG. 8A, the drain current Id was large for the third to sixth conditions CC3 to CC6. As shown in FIG. 8B, the current ISBD was large for the third to sixth conditions CC3 to CC6. As shown in FIG. 9A, the hole current Ih was small for the third to sixth conditions CC3 to CC6. As shown in FIG. 9B, the electron current Ie was small for the third condition CC3. The electron current Ie substantially was not generated for the fourth to sixth conditions CC4 to CC6.

Figure 10:
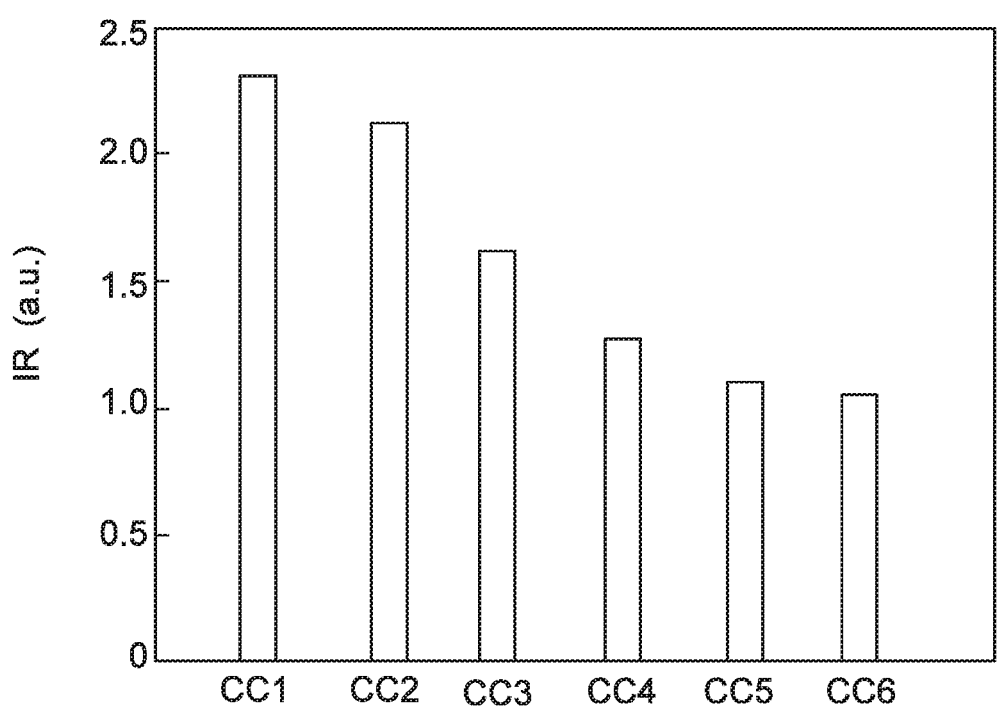
FIG. 10 is a graph illustrating characteristics of the semiconductor device.

The vertical axis of FIG. 10 is an integral IR of the SRH (Shockley-Read-Hall) recombination in the drift region. As shown in FIG. 10, the integral IR in the first element region E1 of the SRH recombination was small for the third to sixth conditions CC3 to CC6. This trend increases when the peak of the impurity concentration of the first conductivity type in the third semiconductor region 13 is high or when the thickness t13 is thick.

In the embodiment, for example, information that relates to the concentration of the impurity is obtained by SIMS analysis (Secondary Ion Mass Spectrometry), etc. For example, the end of a semiconductor region may be taken to be the position at which the concentration of ½ of the peak of the impurity concentration is obtained. For example, the width of the semiconductor region may be taken to be the full width at half maximum for the concentration of the impurity.

According to the embodiments, a semiconductor device can be provided in which the characteristic fluctuation can be reduced.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, conductive layers, compound regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first element region including
    a first semiconductor region of a first conductivity type, the first semiconductor region including a first partial region, a second partial region, and a third partial region,
    a first conductive layer, a second direction from the first partial region toward the first conductive layer crossing a first direction from the second partial region toward the first partial region,
    a second conductive layer, the third partial region being between the second partial region and the second conductive layer in the second direction, the second conductive layer having a Schottky contact with the third partial region,
    a second semiconductor region of a second conductivity type, the second semiconductor region including a first semiconductor portion, the first semiconductor portion being between the first partial region and the first conductive layer in the second direction,
    a third semiconductor region of the first conductivity type, at least a portion of the third semiconductor region being between the first partial region and the first semiconductor portion in the second direction, a concentration of an impurity of the first conductivity type in the third semiconductor region being greater than a concentration of the impurity of the first conductivity type in the first partial region,
the first semiconductor region including a portion directly contacting an other semiconductor portion of the second semiconductor region, a direction from the portion directly contacting the other semiconductor portion toward the other semiconductor portion being along the second direction, a position of the third semiconductor region in the first direction being between a position of the third partial region in the first direction and a position in the first direction of the portion directly contacting the other semiconductor portion.

2. The device according to claim 1, wherein the concentration of the impurity of the first conductivity type in the third semiconductor region is greater than a concentration of the impurity of the first conductivity type in the third partial region.

3. The device according to claim 1, further comprising:
a second element region including at least one of a transistor or a diode,
at least a portion of the first element region being provided outside the second element region.

4. The device according to claim 1, wherein
the first element region further includes a fourth semiconductor region of the second conductivity type,
the fourth semiconductor region is provided between the first semiconductor portion and the first conductive layer in the second direction, and
a concentration of an impurity of the second conductivity type in the fourth semiconductor region is greater than a concentration of the impurity of the second conductivity type in the first semiconductor portion.

5. The device according to claim 4, wherein
the first conductive layer has an ohmic contact with the fourth semiconductor region.

6. The device according to claim 4, wherein
the first element region further includes a first compound region,
the first compound region is provided between the fourth semiconductor region and the first conductive layer, and
the first conductive layer is electrically connected to the fourth semiconductor region via the first compound region.

7. The device according to claim 6, wherein
the first compound region includes a silicide.

8. The device according to claim 1, wherein
the first semiconductor region further includes a fourth partial region,
the first partial region is between the second partial region and the fourth partial region in the first direction, and
a direction from the fourth partial region toward a portion of the third semiconductor region is along the second direction.

9. The device according to claim 4, wherein
the fourth semiconductor region includes a first end and a second end,
a direction from the first end toward the second end is along the first direction,
a position in the first direction of the first end is between a position in the first direction of the third partial region and a position in the first direction of the second end,
the third semiconductor region includes a third end and a fourth end,
a direction from the third end toward the fourth end is along the first direction,
the position in the first direction of the first end is between a position in the first direction of the third end and a position in the first direction of the fourth end, and
the position in the first direction of the second end is between the position in the first direction of the first end and the position in the first direction of the fourth end.

10. The device according to claim 9, wherein
a second distance in the first direction between the position in the first direction of the second end and the position in the first direction of the fourth end is greater than a first distance in the first direction between the position in the first direction of the second end and a position in the first direction of a boundary between the third partial region and the second semiconductor region.

11. The device according to claim 10, wherein
the position in the first direction of the boundary is between the position in the first direction of the third end and the position in the first direction of the first end.

12. The device according to claim 1, wherein
a length along the first direction between the first conductive layer and the second conductive layer is not less than 0.5 µm and not more than 2 µm.

13. The device according to claim 1, wherein
a position in the second direction of a boundary between the second partial region and the third partial region is between a position in the second direction of a boundary between the first partial region and the third semiconductor region and a position in the second direction of a boundary between the third semiconductor region and the second semiconductor region.

14. The device according to claim 4, wherein
the second semiconductor region further includes a second semiconductor portion,
the second semiconductor portion is between the third partial region and the fourth semiconductor region in the first direction,
the first semiconductor region further includes a fifth partial region, and
a portion of the third semiconductor region is between the fifth partial region and the second semiconductor portion in the second direction.

15. The device according to claim 1, wherein
the first element region further includes:
a third conductive layer;
a fifth semiconductor region of the second conductivity type; and
a sixth semiconductor region of the first conductivity type,
the first semiconductor region further includes a sixth partial region,
the fifth semiconductor region includes a third semiconductor portion,
the second partial region is between the sixth partial region and the first partial region in the first direction,
at least a portion of the sixth semiconductor region is between the sixth partial region and the third semiconductor portion in the second direction, and
the sixth semiconductor region is connected to the third partial region, a concentration of an impurity of the first conductivity type in the sixth semiconductor region being greater than the concentration of the impurity of the first conductivity type in the third partial region.

16. The device according to claim 15, wherein
the first element region further includes a seventh semiconductor region of the second conductivity type,
the seventh semiconductor region is provided between the third semiconductor portion and the third conductive layer in the second direction, and
a concentration of an impurity of the second conductivity type in the seventh semiconductor region is greater than a concentration of the impurity of the second conductivity type in the third semiconductor portion.

17. The device according to claim 16, wherein
the first element region further includes a second compound region including a silicide,
the second compound region is provided between the seventh semiconductor region and the third conductive layer, and
the third conductive layer is electrically connected to the seventh semiconductor region via the second compound region.

18. The device according to claim 15, wherein
a distance along the first direction between the third semiconductor region and the sixth semiconductor region is less than a length along the first direction of the second conductive layer.

19. The device according to claim 1, further comprising:
a first electrode; and
a second electrode,
a direction from the first electrode toward the second electrode being along the second direction,
at least a portion of the first semiconductor region being between the first electrode and the second electrode,
the first conductive layer and the second conductive layer being between the first semiconductor region and the second electrode,
the first conductive layer and the second conductive layer being electrically connected to the second electrode.

20. The device according to claim 1, wherein the first semiconductor region, the second semiconductor region, and the third semiconductor region include SiC.

21. The device according to claim 1, wherein a direction from the first semiconductor portion toward the other semiconductor portion is along the first direction.

* * * * *